(12) United States Patent
Aman et al.

(10) Patent No.: US 11,432,422 B2
(45) Date of Patent: Aug. 30, 2022

(54) ELECTRICAL DEVICE WITH A MODULAR STRUCTURE

(71) Applicant: Rohde & Schwarz GmbH & Co. KG, Munich (DE)

(72) Inventors: Stefan Aman, Ottobrunn (DE); Johannes Steffens, Rosenheim (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 19 days.

(21) Appl. No.: 16/664,390

(22) Filed: Oct. 25, 2019

(65) Prior Publication Data
US 2021/0127518 A1 Apr. 29, 2021

(51) Int. Cl.
| H05K 5/04 | (2006.01) |
|---|---|
| H05K 7/20 | (2006.01) |
| H05K 7/14 | (2006.01) |
| H05K 13/04 | (2006.01) |
| H05K 5/02 | (2006.01) |

(52) U.S. Cl.
CPC ............ H05K 5/04 (2013.01); H05K 5/0213 (2013.01); H05K 7/1417 (2013.01); H05K 7/1488 (2013.01); H05K 7/20545 (2013.01); H05K 13/04 (2013.01)

(58) Field of Classification Search
CPC . G06F 2200/201; G06F 1/20; H05K 7/20772; H05K 7/20263; H05K 7/20218; H05K 7/2029; H05K 7/2039; H05K 7/20; H05K 7/20536; H05K 7/20709; H05K 5/04; H05K 5/06; H05K 5/0213; H05K 5/0204; H05K 7/02; H05K 7/1417; H05K 7/1488; H05K 7/20545; H05K 13/04; H05K 5/0095; H01L 23/473; F28D 2021/0031
See application file for complete search history.

(56) References Cited

U.S. PATENT DOCUMENTS

2005/0133214 A1 * 6/2005 Pfahnl ................ H05K 7/20781
165/185
2008/0259566 A1 10/2008 Fried

FOREIGN PATENT DOCUMENTS

| CA | 2666014 A1 | 11/2010 | |
|---|---|---|---|
| CN | 107295761 A | * 10/2017 | ............... H05K 5/04 |
| EP | 2 252 137 A2 | 11/2010 | |
| WO | 2006055776 A2 | 5/2006 | |

* cited by examiner

Primary Examiner — James Wu
(74) Attorney, Agent, or Firm — Ditthavong, Steiner & Mlotkowski (57) ABSTRACT

An electrical device including a skeleton-like frame structure and at least one electrical module is provided. The skeleton-like frame structure has a low rigidity, while the at least one electrical module provides an increased rigidity when mounted.

7 Claims, 5 Drawing Sheets

ELECTRICAL DEVICE WITH A MODULAR STRUCTURE

The invention regards an electrical device having a modular structure with one or more electrical modules being arranged inside a common housing.

In the area of sophisticated electrical devices, such as radiofrequency measurement devices, it is common to customize the final electrical device to the needs of the customer. To produce a variety of different electrical devices thereby satisfying the customer's requirements, a modular structure of the measurement device is helpful. Thus, the electrical device consists of a plurality of electrical modules, each dedicated for one specific purpose. The different electrical modules cooperate to commonly realize the desired functionality of the electrical device. To enable the electrical modules to cooperate with each other, the modules are arranged in a common housing, for example, a so-called rack.

One problem when realizing such a modular structure is that the small entities, namely the modules, are difficult to optimize with respect to an overall cooling structure. The modules may be used in different measurement devices or, at least may be installed in the electrical device in different positions, depending on the overall configuration desired by the customer. All these electrical modules comprise components that generate heat during the operation. A classic electrical device, which comprises a common housing and one or a plurality of printed circuit boards arranged inside the housing, can be designed more easily with respect to cooling aspects of the heat emitting components. However, such a design cannot be easily transferred to the problem of cooling a plurality of electrical modules, each including one or more heat emitting electrical components. Since each of the electrical modules has its own module housing, a rather limited space is available for designing an arrangement for the electrical components of the individual electrical module. Then, the individual electrical modules need to be positioned inside the device housing and only indirect cooling can be realized. Thus, the structure and arrangement of such electrical modules inside a common device housing needs to be optimized in order to ensure that all the electrical components inside the electrical modules are sufficiently cooled in order to avoid failure because of high temperature.

One approach is disclosed in EP 2 252 137 A2, which describes a modular structure of an electronic device comprising a plurality of electrical modules. The invention in EP 2 252 137 A2 describes an open frame electronic chassis with at least two sides of the common device housing being open, specifically the top side and the bottom site thereby providing a passive ventilation means. The top side and the bottom side only consist of beams for supporting the individual electrical modules. The modules are designed to enable an airflow from the bottom site to the top side between them without any additional fan. Thus, the physical effects of a pressure difference caused by the dissipated heat of the electrical modules is used to generate an airstream between the individual modules for cooling their heat emitting electrical components.

One problem of the suggested solution is that the cooling performance is very limited and the design of the individual modules, but also their arrangement inside the electrical device, needs to be adapted accordingly. Thus, the heat generating electrical components inside the individual modules also need to be arranged at positions that allow a good heat transfer to the outside of the electrical module so that dissipation of heat can easily be achieved by the airflow.

Thus, it is an object of the present invention to provide an electrical device with a modular structure having an improved cooling capability thereby increasing flexibility for module arrangement and design freedom.

This object is achieved with the electrical device according to independent claim 1.

According to the invention, the electrical device comprises a device housing including a skeleton-like frame structure, with the frame having a plurality of columns and/or crossbeams. For providing the desired functionalities of the electrical device, the electrical device comprises at least one electrical module that is arranged in the electrical device housing. The electrical module comprises a module housing and is detachably mounted on the frame of the device housing. The module housing accommodates electrical components of the electrical module that are needed for providing the desired functionality of the electrical module.

The device housing comprises columns and/or crossbeams instead of a combination of solid housing walls designed to combine to a self-supporting housing. It is to be noted, that it is preferred that the entire frame structure consists of columns and crossbeams, thereby significantly reducing the overall weight of the housing. Apparently, omitting only some of the housing walls and substituting them by structure made from columns and crossbeams achieves a similar, although less significant effect. In addition to the reduction of weight, also an outer wall does not block an airflow generated in the electrical device, as it would happen with a regular device housing. Contrary, since columns and/or crossbeams are used for defining the overall frame structure of the electrical device's housing, an airflow may be generated nearly to unlimited directions. Such a structure, thus, significantly improves the freedom of design.

The electrical components that are arranged inside the module housing generate heat when being operated. According to the invention, the at least one electrical module is liquid cooled. The cooling circuit is established by connecting the electrical module with a radiator in order to allow exchange of a coolant. For efficiently dissipating the heat generated by the electrical components in the electrical module, the radiator and an active ventilation means are mounted on the electrical device such that the radiator is positioned in an airstream generated by the active ventilation means. The liquid (coolant) transports heat that is generated in the electrical components from the electrical module to the radiator where it is finally dissipated.

Using a liquid for transporting the heat from the electrical module to a radiator significantly improves the flexibility of arranging heat generating electrical components inside the electrical module and, further, the electrical modules inside the electrical device. Arranging the heat generating components directly in or adjacent to an airflow generated by a passive ventilation opening is not necessary anymore. The design of the electrical device may thus be optimized with respect to other aspects like weight size, or the like. It is to be noticed, that the inventive electrical device comprises one or more electrical, liquid cooled modules but may even comprise additional electrical modules that are air cooled. Using liquid cooling has the advantage that it is not necessary to enable an airflow between a plurality of electrical modules that are arranged inside the housing. A major portion of the generated heat is transported by the coolant from the electrical module to the radiator and can be dissipated there.

Additional aspects of the invention are defined in the dependent claims.

Preferably, both, the liquid cooled electrical module as well as the radiator are arranged in the airstream generated by the active ventilation means. Using the airflow that is generated by the active ventilation means not only for improving dissipation of the heat from the radiator but also in order to directly reduce the temperature of the electrical module reduces the amount of heat that must be transported by the coolant to the radiator. Thus, the dimensions of the entire cooling circuit, and especially the lines between the electrical module and the radiator, can be reduced and, thus, space is saved. Further, even in case that the liquid cooling system fails, there is still some kind of emergency cooling system available.

According to another preferred aspect, the electrical components that are accommodated in the module housing are arranged on at least one printed circuit board and this at least one printed circuit board is entirely accommodated inside the module housing. Entirely accommodating the printed circuit board inside the rigid housing gives the possibility to block environmental influence on the electrical components, in particular, caused by dust and dirt. Obviously, it is also possible to accommodate more than one printed circuit board inside the module housing, or a combination of discrete electrical components together with a printed circuit board or a plurality thereof.

Hermetically sealing the module housing even improves protection of the components arranged inside the electrical module.

According to another advantageous aspect, the electrical device comprises a common front plate module. The common front plate module can provide a plurality of functions common to the entirety or a plurality of electrical modules arranged inside the electrical device. The use of a common front plate can save costs by avoiding redundancy of components. Further, the common front plate what you can cover one outer surface of the electrical device by being attached to the frame structure.

According to a preferred embodiment, the at least one electrical module (and preferably all electrical modules of the electrical device) and the common front plate module are connected via respective interfaces on the electrical module side and the common front plate module side. These interfaces are adapted for exchanging information but maybe all configured also for providing electric power to the respective module. The front plate module may thus constitute a central part of a bus system of the electrical device.

Further, it is preferred that a plurality or even all modules inside the electrical device are connected to a same potential. This same potential maybe any predetermined potential, in particular ground potential.

It is further preferred that the module housing is a rigid module housing, which, by inserting the rigid module housing in the skeleton-like frame structure, improves the overall rigidity and stiffness of the electrical device. This is achieved by attaching the electrical module in the device housing to the frame structure such that the electrical modules rigidity counteracts a distortion of the device housing. Thus, the supporting portions and joints between the electrical module and the frame structure are configured to transmit forces from one element to the other, namely from an element of the frame structure to the electrical module and vice versa. For example, a force exerted on one of the columns and/or crossbeams of the device housing can be distributed to other columns and/or crossbeams all using the rigidity of the electrical module housing. Since the module housing itself is rigid, the force transmitted to the electrical module is also absorbed by generating mechanical tension in the modules housing. Thus, rigidity and stiffness of the electrical device housing is enhanced by inserting one or more electrical modules. Using the rigidity of the electrical modules housing makes it possible that the skeleton-like frame structure of the device housing has only a limited rigidity when taken alone, for example, even less then defined in applicable standards (for example, DIN EN 61010-1). Mounting at least one, preferably a plurality of electrical modules increases the rigidity such that the finally established electrical device shows a rigidity fulfilling the requirements of the standard. It is designed to allow the frame structure of the electrical device with less material since the requirement regarding rigidity and stiffness need not to be fulfilled by the frame structure alone. This results in the final electrical device to have a reduced weight.

Further, the module housing accommodates the electrical components necessary for providing the desired functionality. Thus, a rigid structure of the module housing is not only provided in order to improve the overall rigidity and stiffness of the device housing, but, at the same time it protects the accommodated electrical components. Of course, after the electrical device has been manufactured, electrical components could also be protected from damage by a self-supporting housing of an electrical device. However, using rigid module housings of the individual electrical modules for taking over structural tasks of the device housing has the advantage that even during the manufacturing process of the device, storage and shipping of the electrical modules, the electrical components are protected. Additional measures for avoiding damage to the electrical components become unnecessary. Since the rigidity of the electrical module's housing may be advantageously used for protecting the electrical components, two advantages can be achieved at the same time: first, protection of the electrical components, and, second, an improved device housing structure.

Further, it is preferred that the module housing consists of metal or comprises a metal coating. Particularly, forming the rigid module housing directly from metal has the advantage that RF radiation shielding and rigidity of the housing may be achieved easily at the same time. On the other hand, it might be preferred to make the module housing from a different material, for example, in order to realize some complex shapes that may be produced more cost efficient by using molded resin. In that case, and RF radiation shielding can be realized by coating the module housing with metal. In the sense of the present invention a metal housing may also be realized by a perforated plate of metal and metal coating can also be a mesh structure, with the dimensions of the mesh being adapted to the radiofrequency to be shielded.

According to another preferred aspect, the electrical device comprises a plurality of electrical modules that accommodated in the device housing. At least one of these electrical modules is galvanically separated from other modules.

Further, it is preferred that the printed circuit board that is arranged inside the rigid module housing is fixed to the module housing by screwing or clamping. Although mechanical tension on the printed circuit board generally shall be avoided, using the printed circuit board as an integral component in the electrical module even increases rigidity of the electrical module housing. On the other hand, the printed circuit board is always arranged in a well-defined position and it can easily be avoided that accidental and uncontrolled movements are experienced by the printed circuit board, for example, caused by the handling of a mobile electrical device. This also helps to increase the life expectation of the electrical components and their connections to the printed circuit board and, thus, the entire electrical module.

Details and aspects of the electrical device according to the invention will now be explained with reference to the annexed drawings in which.

Figure 1:
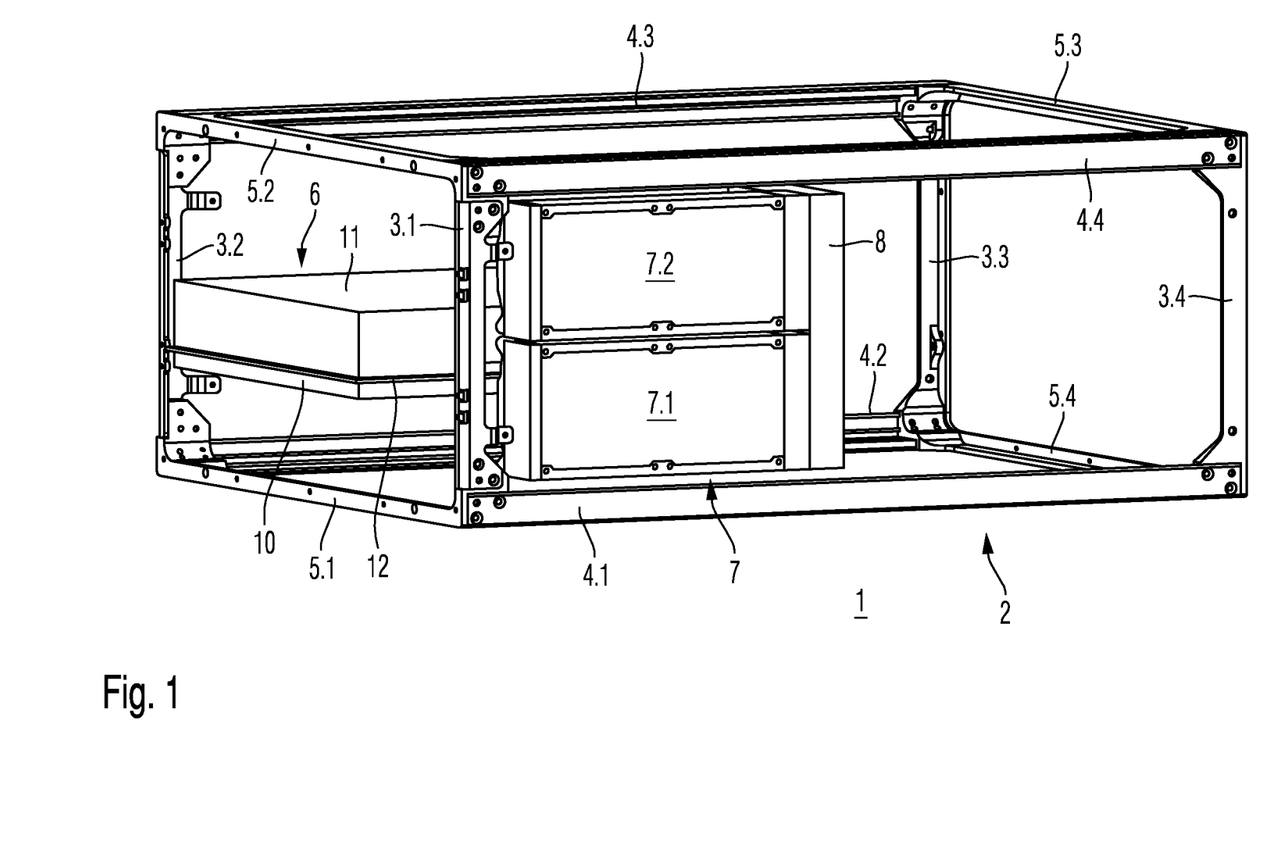
FIG. 1 shows an embodiment of the inventive electrical device in a first perspective.

FIG. 1 shows a first perspective of the electrical device 1 according to the present invention showing the major components according to the present invention. The embodiment that is shown in a first perspective has a device housing including a skeleton-like frame structure 2. The skeleton-like frame structure 2 consists of a plurality of columns and crossbeams. In the illustrated embodiment the columns 3.1, 3.2, 3.3 and 3.4 extend in the vertical direction of the electrical device 2 assuming an intended position of the electrical device 1 during operation, and are all parallel to each other. In the preferred embodiment, which is shown in FIG. 1, the vertical columns 3.1, 3.2, 3.3 and 3.4 arranged at the outer edges of the electrical device 1.

Respective upper and lower ends of the vertical columns 3.1, 3.2, 3.3, 3.4 are connected by crossbeams 4.1, 4.2, 4.3 and 4.4 and also by crossbeams 5.1, 5.2, 5.3 and 5.4. All the columns 3.$i$ and crossbeams 4.$i$ and 5.$i$ are relatively small in cross-section and thus define the outer edges of the device housing having a box shape, thereby forming a frame. This frame 2 may have only rather limited rigidity and stiffness, which allows to reduce amount of material used for building. Further, weight of the frame is limited.

Inside the device housing an electrical module 6 is arranged and fixed in a not illustrated manner to the vertical column 3.2. One exemplary way of fixing and attaching the electrical module 6 to the column 3.2 will be explained later with reference to FIGS. 4, 5 and 6. Generally, the specific way of attaching the electric module 6 to the frame 2 maybe chosen from available and well known techniques. However, the fixation shall be selected such, that forces may be transmitted from the frame elements, in the present case: 3.2, to the electrical module 6 and vice versa.

Inside the electric module 6 there are arranged a plurality of electrical components that are necessary for providing the intended functionality of the respective electrical module 6. The electrical module 6 is integrated in a cooling circuit, in which a liquid transports heat that is generated by the electrical components of the electrical module 6 to a radiator 7, where the heat is finally dissipated. As shown in the illustrated embodiment, the radiator 7 may be formed by a plurality of smaller radiator units 7.1 and 7.2. It is preferred that the plurality of smaller radiator units 7.1 and 7.2 are arranged in a common plane adjacent to each other and that all radiator units 7.1 and 7.2 forming the radiator 7 are of the same type and size. Both radiator units 7.1 and 7.2 of the illustrated embodiment are connected to a common coolant reservoir 8. The fluid connection of the radiator units 7.1 and 7.2 may be established by establishing a direct fluid connection of the radiator units 7.1 and 7.2 and each of the radiator units 7.1 and 7.2 having a single connection to the electrical module 6, one of which forms a coolant inlet and one a coolant outlet. Alternatively, each of the radiator units 7.1 and 7.2 may have 2 fluid connections constituting individual inlet/outlet terminals, for example, for connecting to individual electrical modules.

For establishing the cooling circuits, coolant lines connect the radiator units 7.1 and 7.2 with the housing of the electrical module 6. As it can be seen in FIG. 1, and also in FIGS. 2 and 3, the housing of the electrical module 6 consists of a lower housing part 10 and an upper housing part 11. Both housing parts 10, 11 have a rigid structure and, in the illustrated embodiment, a closed surface. It is preferred to make the lower housing part 10 and the upper housing part 11 from metal in order to provide RF shielding capabilities by the housing of the electrical device 6.

The electrical module 6 is firmly attached to the frame 2 of the electrical device 1 thereby increasing rigidity and stiffness of the frame 2 by the electrical module 6. The electrical module 6 shown in FIG. 1 comprises a mounting element 12 sandwiched between the lower housing part 10 and the upper housing part 11.

Figure 2:
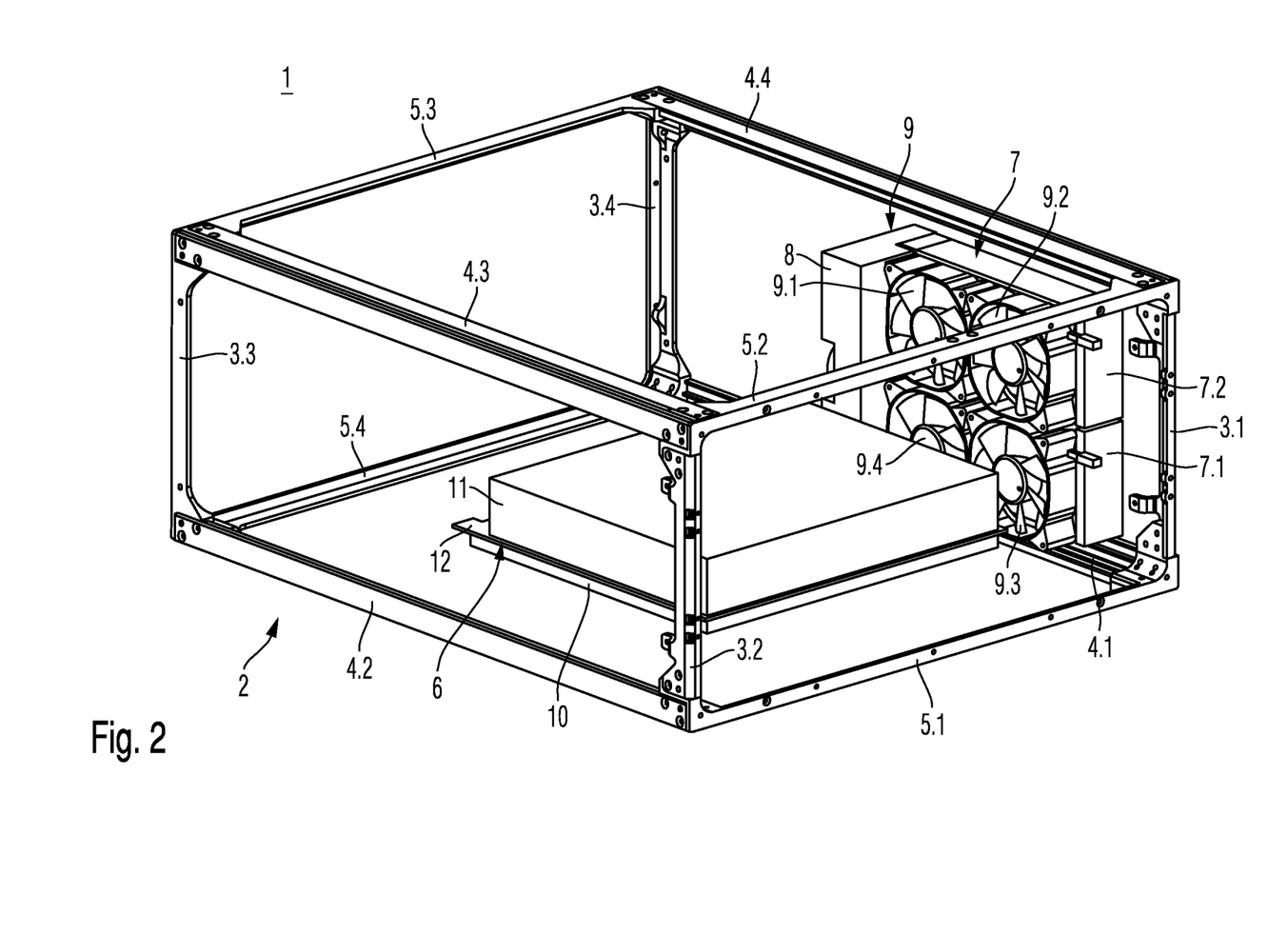
FIG. 2 shows the electrical device of FIG. 1 in a second perspective.

Coming now to FIG. 2, showing the same electrical device 1 from a second perspective, it can be seen that the mounting element 12 protrudes at least in some areas from the housing of the electric module 6 between the lower part 10 and the upper part 11. These protruding portions of the mounting element 12 are used to firmly secure the electrical module 6 to the frame elements, namely the columns 3.$i$ or additional supporting elements, which are not illustrated in FIGS. 1 to 3. Such an additional supporting element will be explained later with respect to FIGS. 4 to 6.

As mentioned above already, the radiator 7 is formed by a first radiator unit 7.1 and a second radiator unit 7.2. These radiator units 7.1 and 7.2 are arranged in a single plane adjacent to each other, thereby establishing a common outer surface. In the illustrated embodiment, this common outer surface is oriented towards the outside of the electrical device 1. A further common surface on the opposite side of the radiator 7 is oriented towards the interior of the electrical device 1. Adjacent to this interior common surface of the radiator units 7.1 and 7.2 an active ventilation means 9 is arranged. The active ventilation means 9 of the illustrated embodiment, consists of four individual fans 9.1, 9.2, 9.3 and 9.4. Of course, a different number of fans or even a single fan may be used as active ventilation means 9.

It is preferred that the plurality of fans 9.1, 9.2, 9.3 and 9.4 is controlled such that the air stream generated by the active ventilation means 9 is adapted to a cooling requirement of the electrical device 1. Most preferred, each of the fans 9.1, 9.2, 9.3 and 9.4 constituting the active ventilation means 9 can be controlled individually.

It is to be noted that in the preferred and illustrated embodiment, the active ventilation means 9 is attached directly to the radiator 7. However, the active ventilation means 9 and the radiator 7 may be mounted inside the housing of the electrical device 1 with a distance between the active ventilation means 9 and the radiator 7. According to the invention, it is only necessary, that the radiator 7 is arranged to be in an airflow that is generated by the active ventilation means 9. Further, the electrical module 6 is also arranged in the airflow generated by the active ventilation means 9. It is further particularly preferred that the active ventilation means 9 is positioned between the radiator 7 and the electrical module 6 with the electrical module 6 arranged on the suction side of the active ventilation means 9. This gives the opportunity to locate the radiator 7 towards an outer surface of the housing of the electrical device 1 thereby covering the impellers of the fans 9.1, 9.2, 9.3 and 9.4. Thus, additional safety measures for protecting contacts of a person with the impellers of the fence 9.1, 9.2, 9.3, and 9.4 is unnecessary.

The entire cooling strategy preferably uses the airflow that is generated by the active ventilation means 9 for forcing an airflow through the radiator 7 but also cooling the electrical module 6 directly by the airflow. Arranging the electrical module 6 in the airflow generated by the active ventilation means 9 reduces the amount of heat that needs to be transported from the electrical module 6 to the radiator 7. The reduced amount of heat that needs to be transported to the radiator 7 requires less cross-section of the lines connecting the electrical module 6 to the radiator 7 and also the passages inside the electrical module 6. Thus, less space is required for the connecting lines of the cooling circuit and an improved usability of the interior space of the electrical device 1 is achieved. Further, even in case that there is a leakage of coolant, and the cooling circuits loses performance, there is still the possibility to reduce the temperature of the electrical module 6 and the expected time to failure of the module 6 can be extended.

Figure 3:
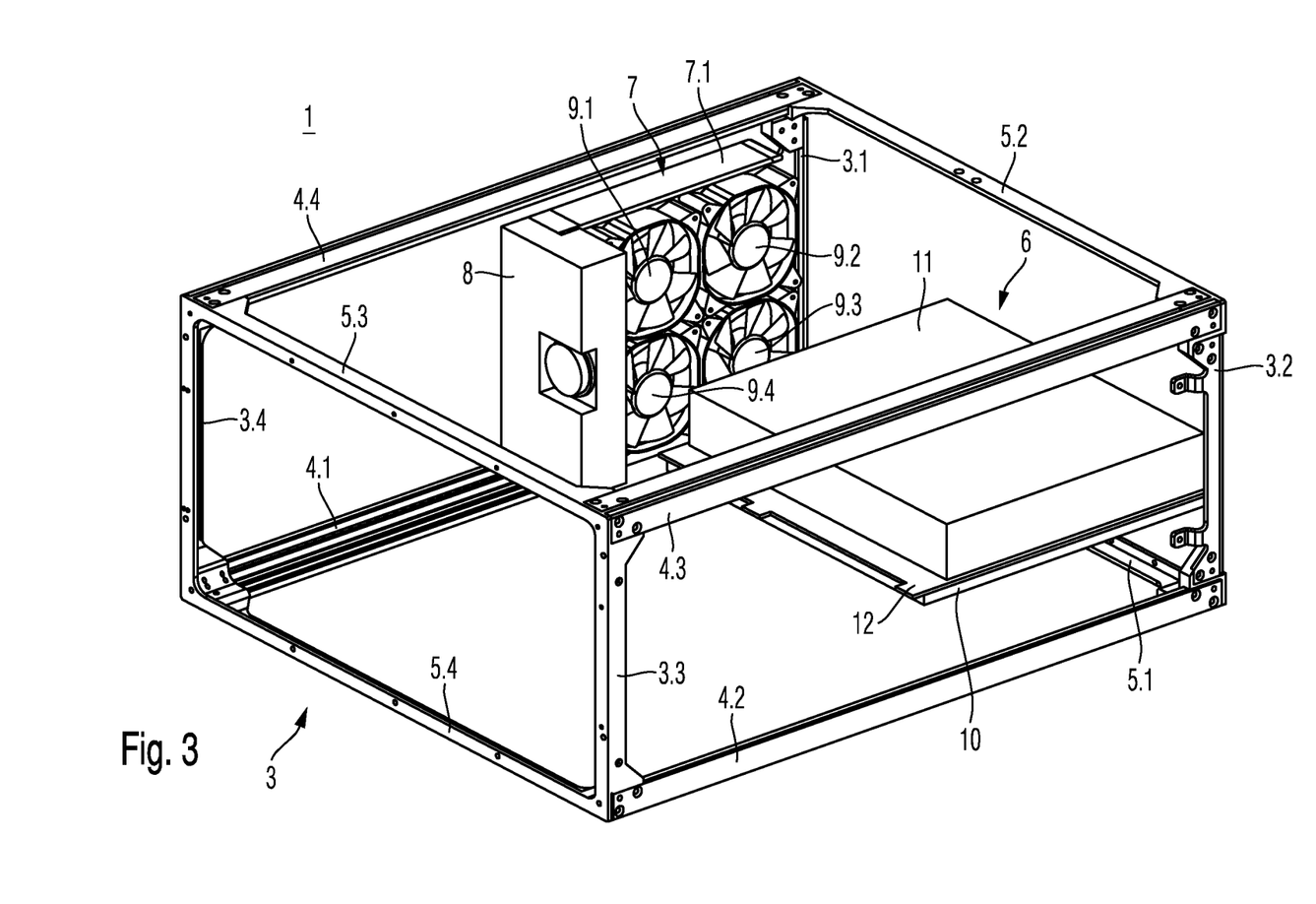
FIG. 3 shows the electrical device of FIG. 1 or 2 in a further perspective for illustrating the general structure and major components of the electrical device.

FIG. 3 show a further perspective of the electrical device 1. In order to avoid unnecessary repetitions it is referred to the explanations given with respect to FIGS. 1 and 2.

The common coolant reservoir 8 has a fill opening allowing to fill the system with a coolant. Further, columns 3.3 and 3.4 together with crossbeams 5.3 and 5.4, for example, define a front surface of the housing of the electrical device 1. A common front panel is attached to the frame 2 at the front surface (not shown in the drawings). The common front panel and the electrical module 6 are electrically connected to each other via respective interfaces. The interfaces may be used to transfer data only, but also to provide either the common front panel or the electric module 6 with electric power. In case that only data is transferred via the interface, each of the common front panel and the electrical module 6 connected to the common front panel need their own electrical power supply. Of course, all electrical modules that are arranged inside the electrical device 1 and also the common front panel may be supplied with electrical power by a dedicated further module which is included in the electrical device 1 for generating electric power and supplying it to all the individual components.

It is to be noted that for improvement comprehensibility of the illustration of the inventive electrical device 1, only a single electrical module 6 is shown. However, it is possible to arrange two or more electrical modules inside the housing of the electrical device 1. These electrical modules of the plurality of modules, or at least a portion thereof, is preferably electrically connected to a same potential, which may be ground potential. Further, at least one of the plurality of electrical modules may be galvanically isolated from the other electrical modules. Finally, it is possible to connect only one of the electrical modules, a plurality of the electrical modules or even all of the electrical modules of the plurality to the coolant circuit. Modules that are not connected to the cooling circuit may be cooled by an airflow only which does not needs to be the airflow generated by the active ventilation means 9, necessarily. In such a case, all it is preferred, that a gap between the individual modules is maintained to enable the airflow.

One of the advantages of the skeleton-like frame structure is that no dedicated ventilation openings must be implemented in a closed wall housing of the electrical device 1. This reduces the velocity of the airflow and thereby in the end also the noise caused by the airflow generated by the active ventilation means 9. On the other side, the active ventilation means 8 may be arranged at almost arbitrary positions together with the radiator 9, and maybe even the electrical modules 6. The positioning of the active ventilation means 9 together with the radiator 7 and the electrical module 6 is not limited by an existing passive ventilation opening in an outer wall of the housing of the electrical device 1. Using the coolant circuit further improves flexibility of arranging the electrical components that generate the heat inside the electrical module 6 because the specific position of the electrical component relative to the position of the active ventilation means 9 is of less importance compared to an air cooled device.

Figure 4:
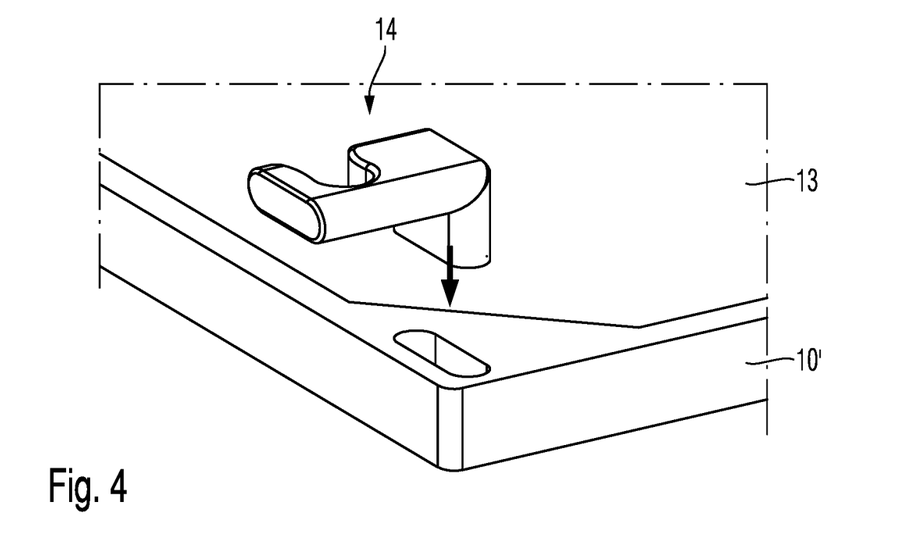
FIG. 4 shows a detail of an electrical module with a rigid module housing for increasing the rigidity of the device housing.
Figure 5:
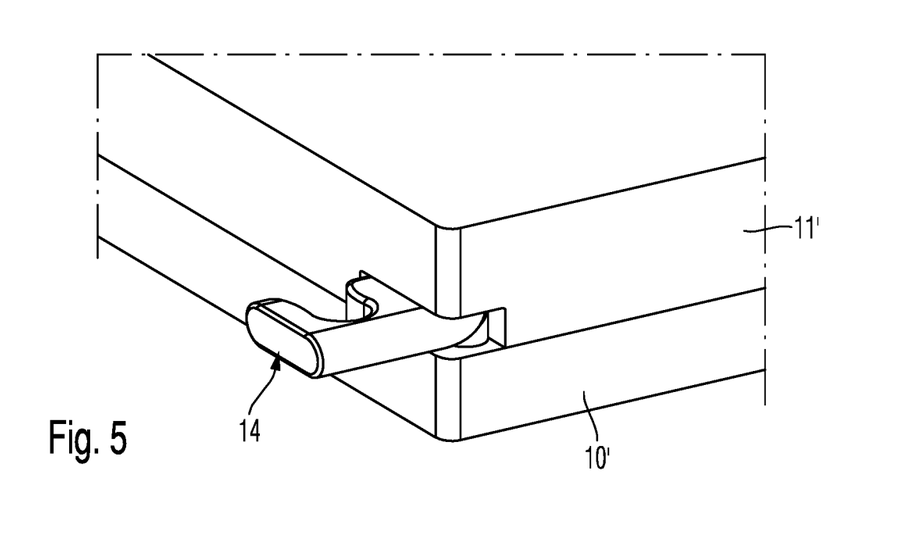
FIG. 5 shows the detail of electrical module of FIG. 4 after the housing of the electric module is closed.

FIG. 4 shows a detail of the electrical module 6. Contrary to the electrical module 6 as shown in FIGS. 1 to 3, there is no supporting elements 12 protruding from all sides from the housing of the electrical module 6. However, the lower parts 10' includes a recess in which the printed circuit board 13 is inserted. The printed circuit board 13 has a cut-off corner corresponding to the oblique shape of the recess in the lower part 10' of the housing of the electrical module 6'. Separated from the recess for accommodating the printed circuit board 13, there is a second recess close to the edge of the lower part 10' into which a fixation element 14 is inserted. The fixation element 14 extends to one lateral side so as to protrude from the housing of the electrical module 6' after closing the housing. FIG. 5 illustrates the housing of the electrical module 6' after the upper housing part 11' has been placed onto the lower housing part 10' for closing the electrical module 6'. As it can be seen from the figure, the fixation element 14 is sandwiched between the lower housing part 10' and the upper housing part 11', which has a cut on portion at the corner of the upper housing part 11' such that a portion of the fixation element 14 may protrude therefrom but the fixation element 14, nevertheless, is held firmly in the further recess of the lower housing part 10'. Thus, no additional measure for keeping the fixation element 14 in place is needed. This reduces manufacturing costs significantly.

As the printed circuit board 13, on which the electrical components providing the desired functionality are placed, is accommodated by a recess of the lower housing part 10', the upper housing part 11' together with the lower housing part 10' can easily accommodate the entire printed circuit board 13 as a fully closed housing. Thus, manufacturing the lower housing part 10 in the upper housing part 11 from metal simultaneously ensures that the printed circuit board together with its electrical components is shielded against RF radiation. Of course, when the printed circuit board 13 is fully enclosed by the housing, a through hole or a cutout portion may be provided in the housing in order to allow electrically contacting the printed circuit board 13.

If the housing parts 10 and 11 are made from a material that cannot provide the RF shielding functionality, it is preferred that the housing parts 10, 10' and 11, 11' are coated with a metal.

Figure 6:
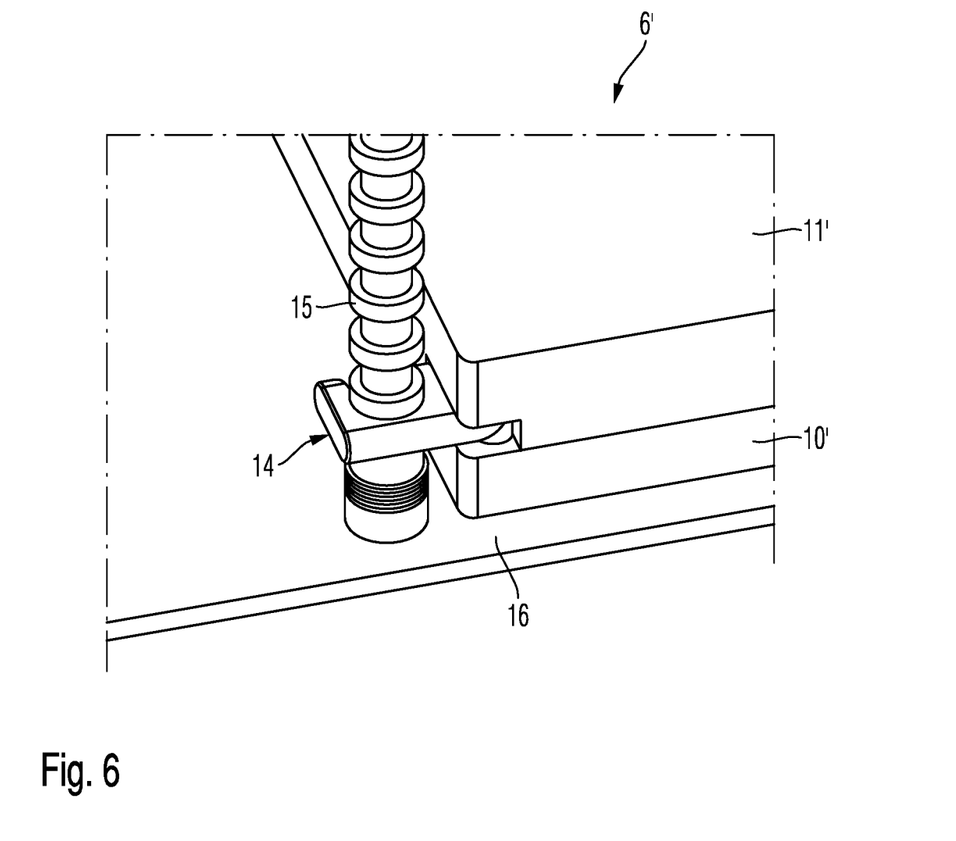
FIG. 6 shows a detail of the electrical module of FIGS. 4 and 5 when inserted into an electrical device for increasing rigidity of the electrical device.

FIG. 6 shows a detail, how the electric module 6 is attached to an additional column 15. The detail shown in FIG. 6 is a variation of the inventive electrical device 1, in which the bottom side of the electrical device 1 comprises a base plate 16 onto which the additional column 15 is placed, it also the other vertical columns 3.1, 3.2, 3.3, and 3.4, which is not shown in FIG. 6. Such an additional column 15 provides a supporting structure in case that the electrical modules do not extend from one column 3.1, 3.2, 3.3 and 3.4 to another one. For example, the electrical module 6 shown in FIGS. 1 to 3 would need such an additional column, or another supporting structure, for supporting the electrical module 6.

This additional column 15 extends in the vertical direction, thus parallel to the other vertical columns, not shown, and may be supported by any of the crossbeams 4.i or 5.i or, as shown in FIG. 6 by the base plate 16 and a corresponding cover or lid at the upper side of the electrical device 1.

As it can be seen in FIG. 6, a number of successive sections having a reduced diameter and an enlarged diameter are arranged along the longitudinal direction of the additional column 15 in an alternating manner. The fixation element 14 has at its protruding portion a recess corresponding in dimension to the reduced diameter of the additional column 15 but with a slightly tempered opening to one site so that it can be clicked to the additional column 15. The thickness (height) of the protruding portion of the fixation element 14 corresponds to the distance between two succeeding enlarged diameter sections of the additional so that the fixation element 14 is held in position even if forces are exerted on the additional column 15. Thus, the connection between the additional column 15 and the electrical module allows to transmit forces exerted on the housing of the electrical device 1, or its frame 2, respectively, to the electrical module 6. The electrical module 6 on the other side can distribute the force to other columns to which the module 6 is attached or absorb its by generating internal mechanical tension in the housing of the electrical module 6. Thus, using the inherent rigidity and stiffness of the electrical module 6 increases the overall rigidity and stiffness of the housing of the electrical device 1.

It is evident that the structure shown in detail in FIG. 6 is only one possibility to achieve a firm attachment between the electrical module 6 and the frame elements, in particular the columns 3.1, 3.2, 3.3 and 3.4. Other techniques may be used as well. Specifically, the module might be fixed in the frame 2 by screws, clamping, and so on.

The invention claimed is:

1. An electrical device, comprising:
a device housing including a skeleton-like frame structure having a plurality of columns and crossbeams,
at least one electrical module having a module housing, wherein the at least one electrical module is detachably mounted on the frame structure, and the module housing accommodates one or more electrical components generating heat when being operated,
wherein the at least one electrical module is liquid cooled and is connected to a radiator for establishing a coolant circuit,
wherein the radiator and an active ventilation means are arranged in the device housing such that the radiator is positioned in an air stream generated by the active ventilation means when the active ventilation means is operated,
wherein the module housing is a rigid modular housing and the fixation of the rigid modular housing in the device housing enables that the module housing's rigidity counteracts a distortion of the device housing,
wherein the at least one electrical module comprises a mounting element sandwiched between a lower housing part and an upper housing part of the module housing,
wherein the mounting element protrudes at least in some areas from the module housing to form protruding portions of the mounting element, and
wherein the protruding portions firmly secure the at least one electrical module to one of the columns or to an additional supporting element comprising an additional column that extends parallel to the other columns and that is supported by one of the crossbeams.

2. The electrical device according to claim 1, wherein both the at least one electrical module and the radiator are arranged in the air stream.

3. The electrical device according to claim 1, wherein the one or more electrical components accommodated in the module housing are arranged on a printed circuit board and the printed circuit board is entirely accommodated inside the module housing.

4. The electrical device according to claim 3, wherein the module housing is hermetically sealed.

5. The electrical device according to claim 1, wherein the at least one electrical module and a common front plate module each comprises an interface for electrically connecting the at least one electrical module to the common front plate module.

6. The electrical device according to claim 1, wherein the at least one electrical module comprises a printed circuit board and the printed circuit board is securely fixed inside the rigid modular housing by screwing or clamping.

7. The electrical device according to claim 1, wherein the rigid modular housing consists of metal or comprises a metal coating for shielding RF radiation.

* * * * *